US008588013B2

United States Patent
Chu (10) Patent No.: US 8,588,013 B2
(45) Date of Patent: Nov. 19, 2013

(54) ADDRESS DECODING METHOD AND SEMICONDUCTOR MEMORY DEVICE USING THE SAME

(75) Inventor: Shin Ho Chu, Icheon (KR)

(73) Assignee: SK Hynix Inc., Gyeonggi-do (KR)

( * ) Notice: Subject to any disclaimer, the term of this patent is extended or adjusted under 35 U.S.C. 154(b) by 153 days.

(21) Appl. No.: 13/336,840

(22) Filed: Dec. 23, 2011

(65) Prior Publication Data

US 2013/0114358 A1   May 9, 2013

(30) Foreign Application Priority Data

Nov. 8, 2011   (KR) .................. 10-2011-0116135

(51) Int. Cl.
*G11C 7/00*   (2006.01)

(52) U.S. Cl.
USPC ............. 365/193; 365/189.011; 365/230.01; 365/230.06; 365/230.08; 365/233.11; 365/233.1; 365/233.12

(58) Field of Classification Search
USPC ............. 365/189.011, 193, 230.01, 230.06, 365/230.08, 233.11, 233.1, 233.12
See application file for complete search history.

(56) References Cited

U.S. PATENT DOCUMENTS

| 7,450,463 B2* | 11/2008 | Lee .................. 365/230.08 |
| 2001/0008282 A1 | 7/2001 | Maeda |
| 2009/0086564 A1* | 4/2009 | Yang et al. .......... 365/230.08 |

FOREIGN PATENT DOCUMENTS

| KR | 10-0513365 B1 | 9/2005 |
| KR | 100884604 B1 | 2/2009 |

\* cited by examiner

*Primary Examiner* — Fernando Hidalgo
(74) *Attorney, Agent, or Firm* — William Park & Associates Patent Ltd.

(57) ABSTRACT

A semiconductor memory device includes: a strobe clock generator configured to generate a strobe clock signal having a delay time controlled according to a plurality of test mode signals which are selectively enabled in response to a read signal or write signal; an internal address generator configured to latch an address in response to a first level of the strobe clock signal, and generate an internal address by decoding the address in response to a second level of the strobe clock signal; and an output enable signal generator configured to decode the internal address and generate output enable signals which are selectively enabled.

15 Claims, 7 Drawing Sheets

ADDRESS DECODING METHOD AND SEMICONDUCTOR MEMORY DEVICE USING THE SAME

CROSS-REFERENCES TO RELATED APPLICATIONS

The present application claims priority under 35 U.S.C. 119(a) to Korean Application No. 10-2011-0116135, filed on Nov. 8, 2011, in the Korean intellectual property Office, which is incorporated herein by reference in its entirety.

BACKGROUND

A semiconductor memory device stores data or outputs stored data according to an operation mode. For example, when an external device such as a central processing unit (CPU) requests data, a semiconductor memory device performs a read operation of outputting data corresponding to an address inputted from the external device requesting the data, or performs a write operation of storing data provided from the external device in a position corresponding to the address.

The read and write operations are performed by using an address path. The address path includes a row address path where data stored in a memory cell is sensed and amplified by an sense amplifier after a word line is selected by a row address, and a column address path where one of a plurality of output enable signals Yi<n> is selected by a column address. An operation related to the column address path (hereafter, referred to as 'column operation') is controlled by a column path circuit including a column decoder. The column path circuit serves to decode a column address, selectively enable one of the output enable signals Yi<n>, and transmit data loaded on a bit line selected by the enabled output enable signal Yi<n> to an input/output line.

Furthermore, the column operation generates the output enable signals Yi<n> using a strobe clock signal CSTR for strobing an address. A semiconductor memory device includes a plurality of control circuits and a data transmission line for reading or writing data, and an input time point of the strobe clock signal CSTR may vary according to a loading variation, caused by the control circuits and the data transmission line, and a PVT (Process Voltage Temperature) variation during the column operation.

Now, an operation of decoding an address to enable an output enable signal during a known column operation will be described. The operation may be divided into a case FAST in which the input of the strobe clock signal CSTR is early and a case SLOW in which the input of the strobe clock signal CSTR is late, depending on a PVT variation.

Figure 1:
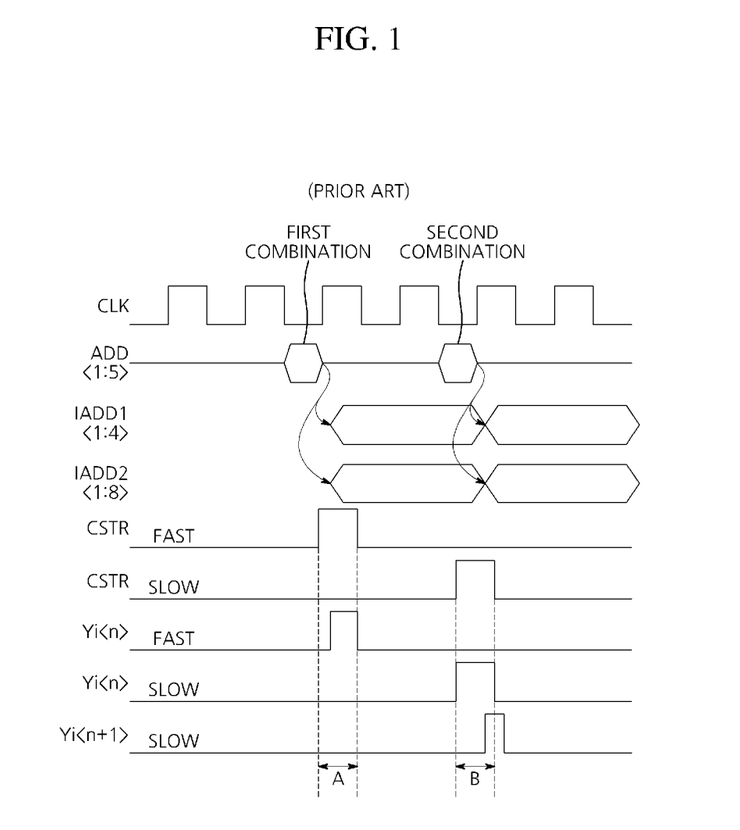
FIG. 1 is a timing diagram of output enable signals generated by decoding an address according to a strobe clock signal during a known column operation.

FIG. 1 is a timing diagram of output enable signals generated by decoding an address according to a strobe clock signal during the known column operation.

First, when the input time point of the strobe clock signal CSTR is at the case FAST, internal addresses IADD1<1:4> and IADD2<1:8> generated according to a first combination of addresses ADD<1:5> are decoded to enable an output enable signal Yi<n> during a period A where the strobe clock signal CSTR is enabled. However, since the strobe clock signal CSTR is inputted at an earlier time point than a set-up time of the internal addresses IADD1<1:4> and IADD2<1:8>, the output enable signal Yi<n> has a small pulse width. Therefore, an error may occur in the read and write operations of the semiconductor memory device.

Next, when the input time point of the strobe clock signal CSTR is at the case SLOW, the internal addresses IADD1<1:4> and IADD2<1:8> generated according to the first combination of the addresses ADD<1:5> are decoded to enable the output enable signal Yi<n> during a period B where the strobe clock signal CSTR is enabled. However, since the input of the strobe clock signal CSTR is delayed, an input time point of internal addresses IADD1<1:4> and IADD2<1:8> generated according to a second combination of the addresses ADD<1:5> overlaps the enable period of the strobe clock signal CSTR. In this case, since the output enable signal Yi<n> enabled according to the first combination of the addresses ADD<1:5> and an output enable signal Yi<n+1> enabled according to the second combination of the addresses ADD<1:5> are enabled, an error may occur in the read and write operations of the semiconductor memory device.

SUMMARY

An embodiment of the present invention relates to a semiconductor memory device capable of delaying an input time point of a strobe clock signal behind a set-up time of an address, and generating output enable signals synchronized with rising edges of the strobe clock signal, thereby substantially preventing a fail during read and write operations of the semiconductor memory device.

In one embodiment, a semiconductor memory device includes: a strobe clock generator configured to generate a strobe clock signal having a delay amount controlled according to first to third test mode signals which are selectively enabled in response to a read signal or write signal; an internal address generator configured to latch an address in response to a first level of the strobe clock signal, and generate an internal address by decoding the address in response to a second level of the strobe clock signal; and an output enable signal generator configured to decode the internal address and generate output enable signals which are selectively enabled.

In another embodiment, an address decoding method includes: generating a strobe clock signal having a delay amount controlled according to first to third test mode signals which are selectively enabled in response to a read signal or write signal; latching an address in response to a first level of the strobe clock signal; and decoding the address in response to a second level of the strobe signal, and generating output enable signals which are selectively enabled.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 2:
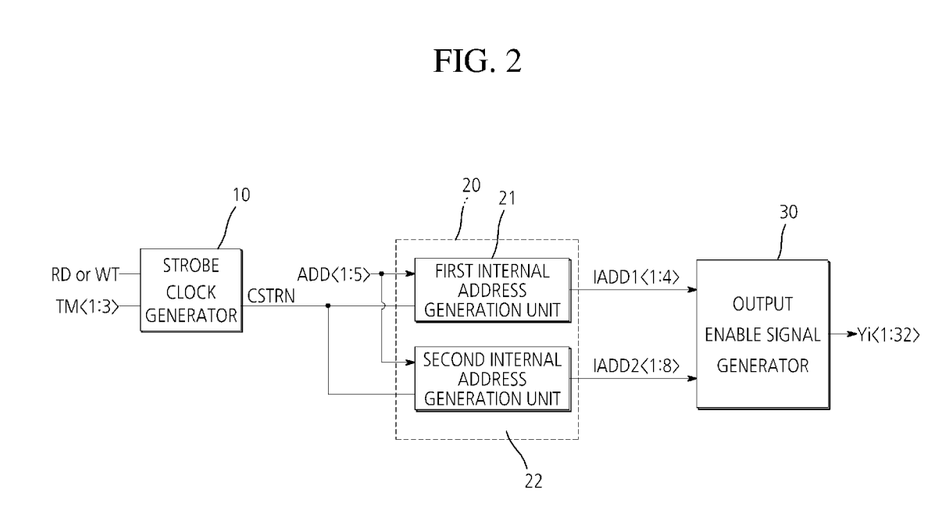
FIG. 2 is a block diagram illustrating the configuration of a semiconductor memory device in accordance with an embodiment of the present invention.

FIG. 2 is a block diagram illustrating the configuration of a semiconductor memory device in accordance with an embodiment of the present invention.

Referring to FIG. 2, the semiconductor memory device includes a strobe clock generator 10, an internal address generator 20, and an output enable signal generator 30. The strobe clock generator 10 is configured to generate a strobe clock signal CSTRN having a delay time controlled according to a plurality of test mode signals, e.g., first to third test mode signals TM<1:3> which are selectively enabled in response to a read signal RD or write signal WT. The internal address generator 20 is configured to latch addresses ADD<1:5> in response to a first level of the strobe clock signal CSTRN, and decode the addresses ADD<1:5> to generate first and second internal addresses IADD1<1:4> and IADD2<1:8> in response to a second level of the strobe clock signal CSTRN. The output enable signal generator 30 is configured to decode the first and second internal addresses IADD1<1:4> and IADD2<1:8> and generate output enable signals Yi<1:32> which are selectively enabled.

The configuration of the strobe signal clock generator 10 will be described in more detail as follows with reference to FIG. 3.

Figure 3:
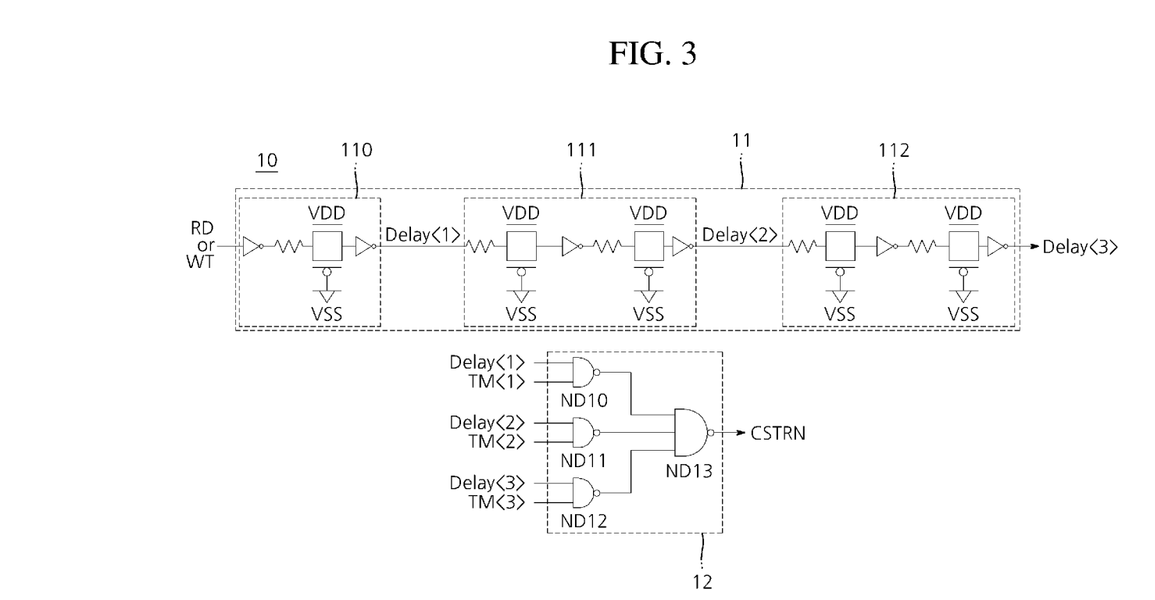
FIG. 3 is a circuit diagram of a strobe clock generator included in the semiconductor memory device of FIG. 2.

Referring to FIG. 3, the strobe signal generator 10 includes a delay signal generation unit 11 and a strobe clock output unit 12. The delay signal generation unit 11 is configured to buffer the read signal RD or write signal WT and generate a plurality of delay signals, e.g., first to third delay signals Delay<1:3>. The strobe clock output unit 12 is configured to buffer one or more of a plurality of delay signals, e.g., the first to third delay signals Delay<1:3> in response to a plurality of test mode signals, e.g., the first to third test mode signals TM<1:3> and output the buffered signal as the strobe clock signal CSTRN.

The delay signal generation unit 11 includes a first delay signal generation section 110, a second delay signal generation section 111, and a third delay signal generation 112. The first delay signal generation section 110 is configured to delay the read signal RD or the write signal WT by a predetermined period and generate the first delay signal Delay<1>. The second delay signal generation section 111 is configured to delay the first delay signal Delay<1> by a predetermined period and generate the second delay signal Delay<2>. The third delay signal generation section 112 is configured to delay the second delay signal Delay<2> by a predetermined period and generate the third delay signal Delay<3>. Here, the third delay signal Delay<3> has a larger delay time than the second delay signal Delay<2>, and the second delay signal Delay<2> has a larger delay time than the first delay signal Delay<1>. Furthermore, the read signal RD is enabled when the semiconductor memory device performs a read operation, and the write signal WT is enabled when the semiconductor memory device performs a write operation.

The strobe clock output unit 12 includes NAND gates ND10 to ND13. The NAND gate ND10 is configured to perform a NAND operation on the first delay signal Delay<1> and the first test mode signal TM<1>. The NAND gate ND11 is configured to perform a NAND operation on the second delay signal Delay<2> and the second test mode signal TM<2>. The NAND gate ND12 is configured to perform a NAND operation on the third delay signal Delay<3> and the third test mode signal TM<3>. The NAND gate ND13 is configured to perform a NAND operation on output signals of the NAND gates ND10 to ND12 and generate the strobe clock signal CSTRN. Here, the strobe clock signal CSTRN has a delay time corresponding to the first delay signal Delay<1> when the first test mode signal TM<1> is enabled, has a delay time corresponding to the second delay signal Delay<2> when the second test mode signal TM<2> is enabled, and has a delay time corresponding to the third delay signal Delay<3> when the third test mode signal TM<3> is enabled. Furthermore, the first to third test mode signals TM<1:3> are selectively enabled in a test mode or selectively enabled according to whether fuse has been cut or not.

The internal address generator 20 includes a first internal address generation unit 21 and a second internal address generation unit 22. The first internal address generation unit 21 is configured to decode the first and second addresses ADD<1:2> and generate the first internal address IADD1<1:4>. The second internal address generation unit 22 is configured to decode the third to fifth addresses ADD<3:5> and generate the second internal address IADD2<1:8>.

The configuration of the first internal address generation unit 21 will be described in more detail as follows with reference to FIG. 4.

Figure 4:
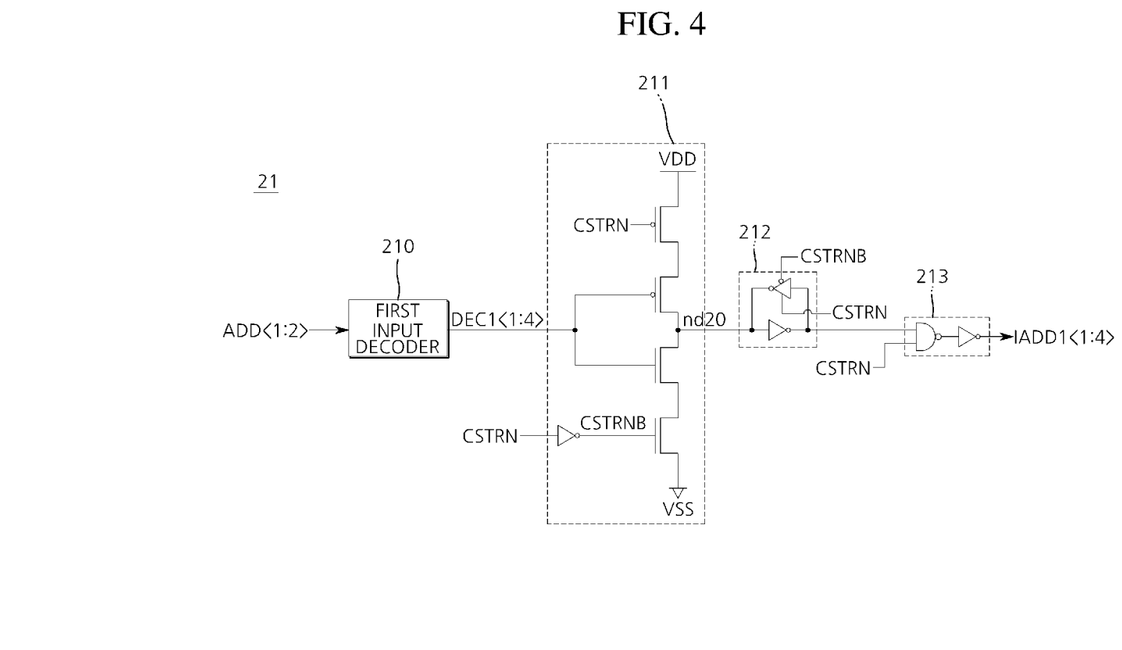
FIG. 4 is a circuit diagram of a first internal address generation unit included in the semiconductor memory device of FIG. 2.

Referring to FIG. 4, the first internal address generation unit 21 includes a first input decoder 210, a first buffer section 211, a first latch section 212, and a logic section 213. The first input decoder 210 is configured to decode the first and second addresses ADD<1:2> and generate a first decoded signal DEC1<1:4>. The first buffer section 211 is configured to buffer the first decoded signal DEC1<1:4> in response to the strobe clock signal CSTRN and output the buffered signal to a first node nd20. The first latch section 212 is configured to latch the signal of the first node nd20 in response to the strobe clock signal CSTRN. The logic section 213 is configured to perform a NAND operation on an output signal of the first latch section 212 and the strobe clock signal CSTRN and generate the first internal address IADD1<1:4>. The first buffer section 211 inverts and buffers the first decoded signal DEC1<1:4> and outputs the buffered signal to the first node nd20, during a period where the strobe clock signal CSTRN is at a logic low level (first level). The first latch section 212 inverts and buffers the signal of the first node nd20, and latches the signal of the first node nd20 during the period where the strobe clock signal CSTRN is at a logic low level (first level).

The configuration of the second internal address generation unit 22 will be described in more detail as follows with reference to FIG. 5.

Figure 5:
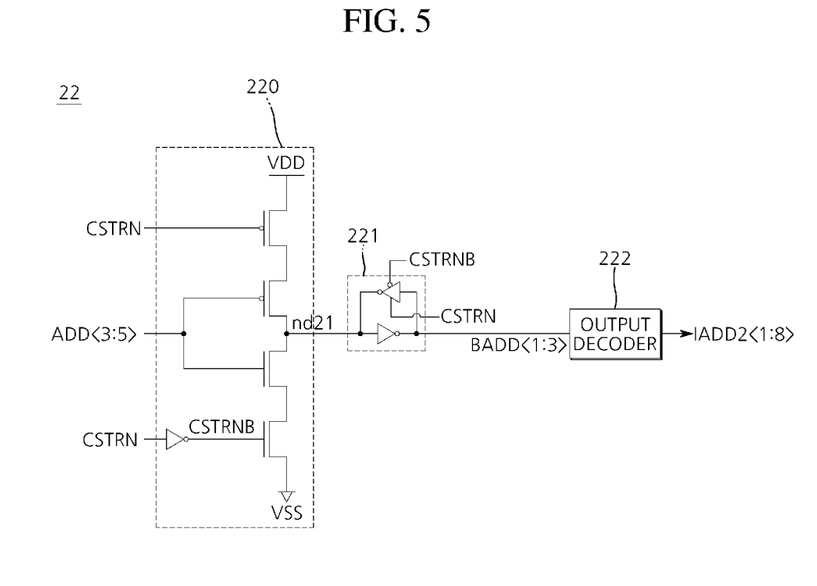
FIG. 5 is a circuit diagram of a second internal address generation unit included in the semiconductor memory device of FIG. 2.

Referring to FIG. 5, the second internal address generation unit 22 includes a second buffer section 220, a second latch section 221, and an output decoder 222. The second buffer section 220 is configured to buffer the third to fifth addresses ADD<3:5> in response to the strobe clock signal CSTRN and output the buffered signal to the second node nd21. The second latch section 221 is configured to latch the signal of the second node nd21 in response to the strobe clock signal CSTRN, and invert and buffer the latched signal to generate an inverted address BADD<1:3>. The output decoder 222 is configured to decode the inverted address BADD<1:3> and generate the second internal address IADD2<1:8>. The second buffer section 220 inverts and buffers the third to fifth addresses ADD<3:5> and outputs the buffered signal to the second node nd21, during the period where the strobe clock signal CSTRN is at a logic low level (first level). The second latch section 221 inverts and buffers the signal of the second node nd21 and outputs the buffered signal as the inverted address BADD<1:3>, and latches the signal of the second node nd21 during the period where the strobe clock signal CSTRN is at a logic low level. The output decoder 222 decodes the inverted address BADD<1:3> and generates the second internal address IADD2<1:8>.

Figure 7:
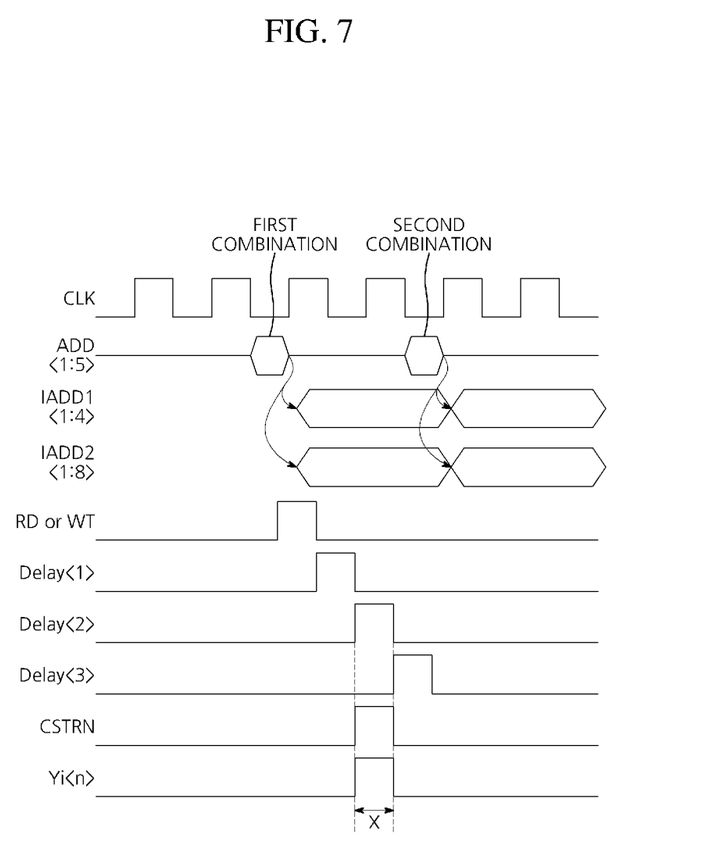
FIG. 7 is a timing diagram of output enable signals generated by decoding an address according to a strobe clock signal during a column operation in accordance with an embodiment of the present invention.

Referring to FIG. 7, the operation of the semiconductor memory device configured in such a manner will be described. The following descriptions will be focused on the operation of decoding the first to fifth addresses ADD<1:5> to generate the output enable signals Yi<1:32> according to the logic level of the strobe clock signal CSTRN, and a case in which the second test mode signal TM<2> is enabled will be taken as an example.

First, the strobe clock generator 10 buffers the second delay signal Delay<2> having a larger delay time than the first delay signal Delay<1> and a smaller delay time than the third delay signal Delay<3> and generates the strobe clock signal CSTRN enabled during a period X, according to the second test mode signal TM<2> which is enabled in the test mode or by fuse cutting.

Then, the first input decoder 210 of the first internal address generation unit 21 decodes the first and second addresses ADD<1:2> and generates the first decoded signal DEC1<1:4>, and the first buffer section 211 inverts and buffers the first decoded signal DEC1<1:4> and outputs the buffered signal to the first node nd20 during the previous period of the period X, where the level of the strobe clock signal CSTRN is at a logic low level (first level). The first latch section 212 latches the signal of the first node nd20 during the previous period of the period X, where the strobe signal CSTRN is at a logic low level (first level), and inverts and buffers the signal of the first node nd20. The logic section 213 performs a NAND operation on an output signal of the first latch section 212 and the strobe clock signal CSTRN, and generates the first internal address IADD1<1:4>. That is, the first internal address generation unit 21 receives and latches the first decoded signal DEC1<1:4> generated by decoding the first and second addresses ADD<1:2> during the previous period of the period X, where the strobe clock signal CSTRN is at a logic low level (first level), and decodes the first decoded signal DEC1<1:4> to generate the first internal address IADD1<1:4> during the period X where the strobe clock signal CSTRN is at a logic high level (second level).

The second buffer section 220 of the second internal address generation unit 22 inverts and buffers the third to fifth addresses ADD<3:5> and outputs the buffered signal to the second node nd21, during the previous period of the period X, where the strobe clock signal CSTRN is at a logic low level (first level). The second latch section 221 latches the signal of the second node nd21, inverts and buffers the signal of the second node nd21, and outputs the buffered signal as the inverted address BADD<1:3>, during the previous period of the period X, where the strobe clock signal CSTRN is at a logic low level (first level). The output decoder 222 decodes the inverted address BADD<1:3> and generates the second internal address IADD2<1:8>. That is, the second internal address generation unit 22 receives and latches the third to fifth addresses ADD<3:5> during the previous period of the period X, where the strobe clock signal CSTRN is at a logic low level (first level). Furthermore, the second internal address generation unit 22 decodes the inverted address BADD<1:3> generated by buffering the third to fifth addresses ADD<3:5> and generates the second internal address IADD2<1:8> during the period X where the strobe clock signal CSTRN is at a logic high level (second level).

The output enable signal generator 30 decodes the first and second internal addresses IADD1<1:4> and IADD2<1:8> and generates the output enable signals Yi<1:32> which are selectively enabled.

The semiconductor memory device configured in such a manner generates the strobe clock signal CSTRN by delaying the input time point of the strobe clock signal CSTRN by a larger delay time than the set-up time of the internal addresses. Furthermore, the semiconductor memory device latches an address during the period where the strobe clock signal CSTRN is at a logic low level (first level), and generates the output enable signals Yi<1:32> by decoding the latched address in the period where the strobe signal CSTRN is at a logic high level (second level). Therefore, an occurrence of a failure during the read and write operations of the semiconductor memory device may decrease.

Figure 6:
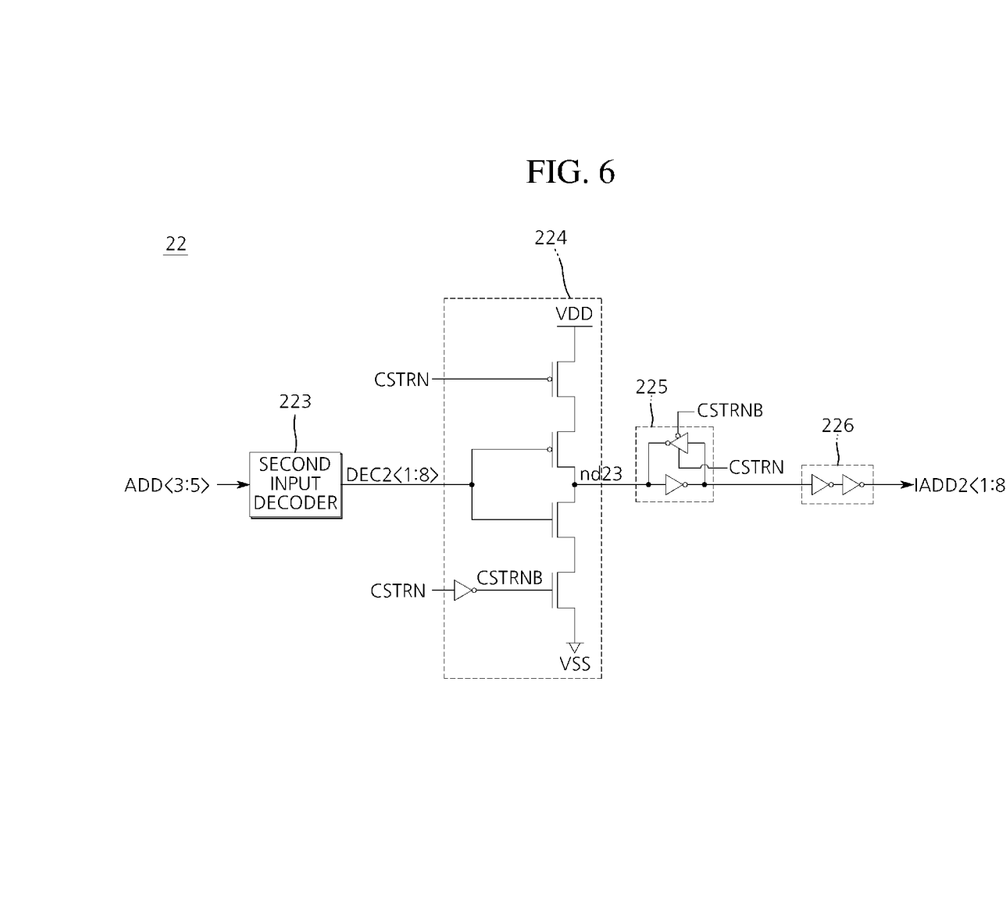
FIG. 6 is a circuit diagram illustrating an example of the second internal address generation unit included in the semiconductor memory device of FIG. 2.

FIG. 6 is a circuit diagram illustrating an example of the second internal address generation unit included in the semiconductor memory device of FIG. 2.

Referring to FIG. 6, the second internal address generation unit 22 includes a second input decoder 223, a third buffer section 224, a third buffer section 225, and a delay section 226. The second input decoder 223 is configured to decode the third to fifth addresses ADD<3:5> and generate a second decoded signal DEC2<1:8>. The third buffer section 224 is configured to invert and buffer the second decoded signal DEC2<1:8> and output the buffered signal to a third node nd23 in response to the strobe clock signal CSTRN. The third latch section 225 is configured to latch the signal of the third node nd23 in response to the strobe clock signal CSTRN. The delay section 226 is configured to buffer an output signal of the third latch section 225 and output the buffered signal as the second internal address IADD2<1:8>. The third buffer section 224 inverts and buffers the second decoded signal DEC2<1:8> and outputs the buffered signal to the third node nd23 during the period where the strobe clock signal is at a logic low level (first level). The third latch section 225 inverts and buffers the signal of the third node nd23, and latches the signal of the third node nd23 during the period where the strobe clock signal CSTRN is at a logic low level (first level).

Referring to FIG. 7, the semiconductor memory device according to an embodiment of the present invention will be described. The following descriptions will be focused on the operation of decoding the first to fifth addresses ADD<1:5> to generate the output enable signals Yi<1:32> according to the logic level of the strobe clock signal CSTRN, and a case in which the second test mode signal TM<2> is enabled will be taken as an example.

First, the strobe clock generator 10 buffers the second delay signal Delay<2> having a larger delay time than the first delay signal Delay<1> and a smaller delay time than the third delay signal Delay<3> and generates the strobe clock signal CSTRN enabled during the period X, according to the second test mode signal TM<2> which is enabled in the test mode or by fuse cutting.

Then, the first input decoder 210 of the first internal address generation unit 21 decodes the first and second addresses ADD<1:2> and generates the first decoded signal DEC1<1:4>, and the first buffer section 221 inverts and buffers the first decoded signal DEC1<1:4> and outputs the buffered signal to the first node nd20 during the previous period of the period X, where the level of the strobe clock signal CSTRN is at a logic low level (first level). The first latch section 222 latches the signal of the first node nd20 during the previous period of the period X, where the strobe signal CSTRN is at a logic low level (first level). The logic section 223 performs a NAND operation on an output signal of the first latch section 222 and the strobe clock signal CSTRN, and generates the first internal address IADD1<1:4>. That is, the first internal address generation unit 21 receives and latches the first decoded signal DEC1<1:4> generated by decoding the first and second addresses ADD<1:2> during the previous period of the period X, where the strobe clock signal CSTRN is at a logic low level (first level), and generates the first internal address IADD1<1: 4> by decoding the first decoded signal DEC1<1:4> during the period X where the strobe clock signal CSTRN is at a logic high level (second level).

The second input decoder 223 of the second internal address generation unit 22 decodes the third to fifth addresses ADD<3:5> and generates the second decoded signal DEC2<1:8>, and the third buffer section 224 inverts and buffers the second decoded signal DEC2<1:8> and outputs the buffered signal to the third node nd23 during the previous period of the period X, where the strobe clock signal CSTRN is at a logic low level (first level). The third latch section 225 latches the signal of the third node nd23 and inverts and buffers the latched signal, during the previous period of the period X, where the strobe clock signal CSTRN is at a logic low level (first level). The delay section 226 buffers an output signal of the third latch section 225 and generates the second internal address IADD2<1:8>. That is, the second internal address generation unit 22 generates the decoded signal DEC2<1:8> by decoding the third to fifth addresses ADD<3: 5>. Furthermore, the second internal address generation unit 22 receives and latches the second decoded signal DEC2<1: 8> and generates the second internal address IADD2<1:8> by buffering the latched signal, during the previous period of the period X, where the strobe clock signal CSTRN is at a logic low level (first level).

Then, the output enable signal generation unit 30 decodes the first and second internal addresses IADD1<1:4> and IADD2<1:8> and generates the output enable signal Yi<1: 32> which are selectively enabled.

The above-described semiconductor memory device in accordance with an embodiment of the present invention generates the strobe clock signal CSTRN by delaying the input time point of the strobe clock signal CSTRN by a larger amount than the set-up time of the internal addresses. In addition, the first combination of the first to fifth addresses ADD<1:5> inputted from outside according to the logic level of the strobe clock signal CSTRN is latched, and the first to 32nd output enable signals Yi<1:32> synchronized with rising edges of the strobe clock signal CSTRN are generated by decoding the latched first to fifth addresses ADD<1:5> at a time point where the strobe clock signal CSTRN is enabled. Therefore, since the output enable signal signals are normally generated, an occurrence of a failure during the read and write operations of the semiconductor memory device may decrease.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:
1. A semiconductor memory device comprising:
   a strobe clock generator configured to generate a strobe clock signal having a delay time controlled according to a plurality of test mode signals which are selectively enabled in response to a read signal or write signal;
   an internal address generator configured to latch an address in response to a first level of the strobe clock signal, and generate an internal address by decoding the address in response to a second level of the strobe clock signal; and
   an output enable signal generator configured to decode the internal address and generate output enable signals which are selectively enabled.

2. The semiconductor memory device of claim 1, wherein the read signal is enabled when the semiconductor memory device performs a read operation, and the write signal is enabled when the semiconductor memory device performs a write operation.

3. The semiconductor memory device of claim 1, wherein the plurality of test mode signals are selectively enabled in a test mode or selectively enabled according to whether fuse has been cut or not.

4. The semiconductor memory device of claim 1, wherein the strobe clock generator comprises:
   a delay signal generation unit configured to buffer the read signal or write signal and generate a plurality of delay signals; and
   a strobe clock output unit configured to buffer one or more of the plurality of delay signals and output the buffered signal as the strobe clock signal, in response to the plurality of test mode signals.

5. The semiconductor memory device of claim 4, wherein if the plurality of delay signals comprise first, second and third delay signals, the third delay signal has a larger delay time than the second delay signal, and the second delay signal has a larger delay time than the first delay signal.

6. The semiconductor memory device of claim 4, wherein the delay signal generation unit comprises:
   a first delay signal generation section configured to delay the read signal or the write signal by a predetermined period and generate the first delay signal;
   a second delay signal generation section configured to delay the first delay signal by a predetermined period and generate the second delay signal; and
   a third delay signal generation section configured to delay the second delay signal by a predetermined period and generate the third delay signal.

7. The semiconductor memory device of claim 1, wherein the internal address generator comprises:
   a first internal address generation unit configured to decode first and second addresses and generate a first internal address; and
   a second internal address generation unit configured to decode third to fifth addresses and generate a second internal address.

8. The semiconductor memory device of claim 7, wherein the first internal address generation unit comprises:
   a first input decoder configured to decode the first and second addresses and generate a first decoded signal;
   a first buffer section configured to buffer the first decoded signal in response to the strobe signal and output the buffered signal to a first node;
   a first latch section configured to latch a signal of the first node in response to the strobe clock signal; and
   a logic section configured to perform a logic operation on an output signal of the first latch section and the strobe clock signal and output the first internal address.

9. The semiconductor memory device of claim 7, wherein the second internal address generation unit comprises:
   a second buffer section configured to buffer the third and fifth addresses in response to the strobe signal and output the buffered signal to a second node;

a second latch section configured to latch a signal of the second node in response to the strobe clock signal and generate an inverted address; and an output decoder configured to decode the inverted address and generate the second internal address.

10. The semiconductor memory device of claim 7, wherein the second internal address generation unit comprises:

a second input decoder configured to decode the third to fifth addresses and generate a second decoded signal;

a third buffer section configured to buffer the second decoded signal in response to the strobe clock signal and output the buffered signal to a third node;

a third latch section configured to latch a signal of the third node in response to the strobe clock signal; and a delay section configured to buffer an output signal of the third latch section and output the buffered signal as the second internal address.

11. An address decoding method comprising:

generating a strobe clock signal having a delay time controlled according to a plurality of test mode signals which are selectively enabled in response to a read signal or write signal;

latching an address in response to a first level of the strobe clock signal; and decoding the address in response to a second level of the strobe signal, and generating output enable signals which are selectively enabled.

12. The address decoding method of claim 11, wherein the generating of the strobe clock signal comprises:

delaying the read signal or the write signal by a predetermined period and generating a plurality of delay signals; and generating the strobe clock signal by buffering one or more of the plurality of delay signals in response to the plurality of test mode signals.

13. The address decoding method of claim 12, wherein the strobe clock signal is generated by buffering one or more of the plurality of delay signals in response to the plurality of test mode signals.

14. The address decoding method of claim 12, wherein if the plurality of delay signals comprise first, second and third delay signals, the third delay signal has a larger delay time than the second delay signal, and the second delay signal has a larger delay time than the first delay signal.

15. The address decoding method of claim 11, wherein the decoding of the address comprises:

generating an internal address by decoding the address in response to the second level of the strobe clock signal; and decoding the internal address and generating the output enable signals which are selectively enabled.

* * * * *